United States Patent
Yan et al.

(10) Patent No.: US 8,847,628 B1
(45) Date of Patent: Sep. 30, 2014

(54) CURRENT MODE LOGIC CIRCUITS WITH AUTOMATIC SINK CURRENT ADJUSTMENT

(71) Applicant: Integrated Device Technology, Inc., San Jose, CA (US)

(72) Inventors: Minhui Yan, San Jose, CA (US); Chien-Chen Chen, San Jose, CA (US); Harmeet Bhugra, San Jose, CA (US)

(73) Assignee: Integrated Device Technology inc., San Jose, CA (US)

( * ) Notice: Subject to any disclaimer, the term of this patent is extended or adjusted under 35 U.S.C. 154(b) by 133 days.

(21) Appl. No.: 13/631,933

(22) Filed: Sep. 29, 2012

(51) Int. Cl.
*H03K 19/094* (2006.01)
*H04L 25/02* (2006.01)

(52) U.S. Cl.
CPC ...... *H03K 19/09432* (2013.01); *H04L 25/0272* (2013.01)
USPC .............................................. 326/115; 326/86

(58) Field of Classification Search
CPC ........... H03K 19/09432; H03K 19/096; H04L 25/0272; H04L 25/028
USPC .................................. 326/82–83, 86, 112, 115
See application file for complete search history.

(56) References Cited

U.S. PATENT DOCUMENTS

| | | | | |
|---|---|---|---|---|
| 4,800,303 A | * | 1/1989 | Graham et al. | 326/72 |
| 7,187,206 B2 | * | 3/2007 | Clements et al. | 326/82 |
| 7,288,971 B1 | * | 10/2007 | Plasterer et al. | 326/127 |
| 7,368,940 B1 | * | 5/2008 | Schultz | 326/38 |
| 7,646,220 B2 | * | 1/2010 | Wu | 326/82 |
| 8,115,513 B2 | * | 2/2012 | Vigoda et al. | 326/52 |
| 8,183,885 B2 | * | 5/2012 | Aziz et al. | 326/86 |
| 8,248,135 B2 | * | 8/2012 | Yu et al. | 327/274 |
| 2004/0041593 A1 | * | 3/2004 | Lai | 326/115 |
| 2009/0153219 A1 | * | 6/2009 | Wu et al. | 327/333 |
| 2013/0207690 A1 | * | 8/2013 | Turnquist et al. | 326/115 |

OTHER PUBLICATIONS

Malek et al. "Designing a fully integrated low noise Tunable-Q Active Inductor for RF applications"; International Journal of Engineering Research and Technology (IJERT); ISSN: 2778-0181; vol. 1, Issue 4, Jun. 2012; pp. 1-5.
Process Corners, http://en.wikipedia.org/wiki/Process_corners; Downloaded Oct. 23, 2012; 3 pages.

* cited by examiner

*Primary Examiner* — Jason M Crawford
(74) *Attorney, Agent, or Firm* — Myers, Bigel, et al.

(57) ABSTRACT

Integrated circuit devices may utilize automatic methods for adjusting the tail currents of current mode logic (CML) cells, which compensate for variations in process corners and thereby enable reliable operation of high performance circuits, such as frequency synthesizers. An integrated circuit may include a current mode logic (CML) circuit responsive to at least one input signal and a variable current source electrically coupled to the CML circuit. This variable current source can be configured to sink (or source) a first current from (or to) the CML circuit in response to a control signal. A control circuit may also be provided, which is configured to generate the control signal in response to a process corner indication signal. This process corner indication signal, which may be generated by a process corner detection circuit, preferably has a magnitude that estimates a relative speed of a process corner associated with the integrated circuit device.

20 Claims, 4 Drawing Sheets

US 8,847,628 B1

CURRENT MODE LOGIC CIRCUITS WITH AUTOMATIC SINK CURRENT ADJUSTMENT

FIELD OF THE INVENTION

The present invention relates to integrated circuit devices and, more particularly, to integrated circuit devices that can operate in low power applications.

BACKGROUND OF THE INVENTION

Integrated circuit devices may utilize different types of circuit topologies for different applications. For example, some integrated circuit devices may utilize current mode logic (CML) circuits for high speed and/or low power applications. As will be understood by those skilled in the art, current mode logic (a/k/a source-coupled logic) is a differential digital logic family configured to transmit data at relatively high speeds. The transmission of data is typically point-to-point and unidirectional and terminated at a destination with 50Ω resistors to Vcc on differential lines. CML can be the physical layer used in DVI and HDMI video links, and is frequently used in interfaces to fiber optic components. CML has also been widely used in the design of high-speed integrated systems, such as in telecommunication systems (e.g., serial data transceivers, frequency synthesizers, etc.). The fast operation of CML circuits is mainly due to their lower output voltage swing compared to static CMOS circuits as well as the very fast current switching taking place at differential input transistors. Recently, CML topologies have been used in ultra-low power applications. Studies have shown that while the leakage current in conventional static CMOS circuits is becoming a major challenge in lowering energy dissipation, higher levels of control of current consumption in CML circuits may make them better candidates for low power applications. Thus, high-end clock circuits requiring very low phase noise and low current consumption may utilize CML cells.

Moreover, these CML cells must frequently be capable of operating correctly at extremes in the process corners, which frequently represent three or six sigma variations from nominal doping concentrations (and other parameters) in transistors on a silicon wafer. Among other things, these process variations can cause significant changes in the duty cycle and slew rate of digital signals and thereby limit the process yield of high performance circuits. Thus, while the nominal tail current of a CML cell may remain relatively constant independent of process corner, for the same operation frequency, a CML cell with a slow/fast process corner typically requires higher/lower tail current to perform well.

As will be understood by those skilled in the art, one naming convention for process corners is to use two-letter designators, where the first letter refers to the N-channel MOSFET (NMOS) corner, and the second letter refers to the P-channel MOSFET (PMOS) corner. Using this naming convention, three corners exist: typical, fast and slow. Fast and slow corners exhibit carrier mobilities that are higher and lower than normal, respectively. Thus, a corner designated as FS denotes fast NFETs and slow PFETs.

SUMMARY OF THE INVENTION

Integrated circuit devices according to embodiments of the invention may utilize automatic methods for adjusting the tail currents of current mode logic (CML) cells, which compensate for variations in process corners and thereby enable reliable operation of high performance circuits, such as frequency synthesizers. According to some of these embodiments of the invention, an integrated circuit may include a current mode logic (CML) circuit responsive to at least one input signal and a variable current source electrically coupled to the CML circuit. This variable current source can be configured to sink (or source) a first current from (or to) the CML circuit in response to a first control signal. A control circuit may also be provided, which is configured to generate the first control signal in response to a process corner indication signal. This process corner indication signal, which may be generated by a process corner detection circuit, preferably has a magnitude that estimates a relative speed of a process corner associated with the integrated circuit device. In particular, the process corner indication signal can have a magnitude that estimates a relative speed of an NMOS or PMOS process corner associated with the integrated circuit device.

According to some embodiments of the invention, the process corner detection circuit may include a MOS diode (e.g., NMOS diode), which is configured to generate the process corner indication signal. According to additional embodiments of the invention, the first control signal may be a multi-bit digital signal and the variable current source may include a plurality of parallel-connected MOS transistor circuits having commonly-connected gate terminals. Moreover, one or more of the plurality of parallel-connected MOS transistor circuits may include a respective switch, which is responsive to a corresponding bit of the multi-bit digital signal. The variable current source may also include a current mirror, which can be utilized to set a baseline current (e.g., minimum sink current).

According to still further embodiments of the invention, the control circuit may include an analog-to-digital converter, which is responsive to the process corner indication signal and a reference voltage. The CML circuit may include any one of a number of conventional CML cells, including a D-type latch, which is responsive to a pair of differential input signals and a pair of differential clock signals.

An integrated circuit device according to additional embodiments of the invention includes a current-mode logic (CML) circuit containing a head circuit, which is configured to generate an output signal in response to at least one input signal, and a tail circuit, which is electrically coupled to the head circuit. This tail circuit includes a variable current source therein, which is responsive to at least one control signal, and a control circuit, which is configured to generate the at least one control signal in response to a process corner indication signal. A process corner detection circuit may also be provided, which is configured to generate the process corner indication signal having a magnitude that estimates a relative speed of a process corner associated with the CML circuit. In particular, the process corner indication signal may have a magnitude that estimates a relative speed of an NMOS or PMOS process corner associated with the CML circuit. According to some of these embodiments of the invention, the process corner detection circuit includes a voltage divider having a MOS diode therein and the process corner indication signal is generated at a gate terminal of the MOS diode. The control circuit may also include an analog-to-digital converter, which is responsive to the process corner indication signal.

DETAILED DESCRIPTION OF EMBODIMENTS

Figure 1:
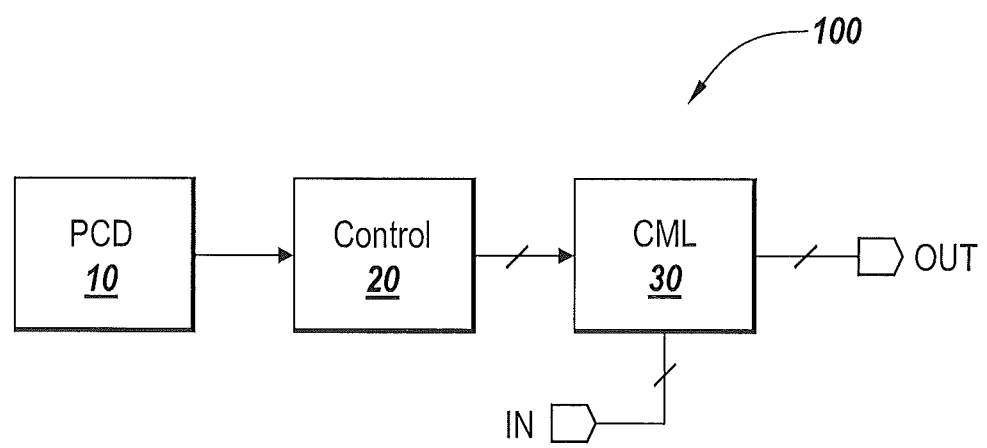
FIG. 1 is a block diagram of an integrated circuit device with current mode logic (CML) according to an embodiment of the present invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Referring now to FIG. 1, an integrated circuit device 100 according to an embodiment of the present invention is illustrated as including a process corner detection (PCD) circuit 10, a control circuit 20 and a current mode logic (CML) circuit 30. As illustrated, the control circuit 20 is responsive to a signal generated by the PCD circuit 10 and the CML circuit 30 is responsive to at least one control signal generated by the control circuit 20 and an input signal IN. The input signal IN may be a differential input signal and the CML circuit 30 may be a synchronous circuit responsive to at least one clock signal (e.g., CK/CKb).

Figure 2A:
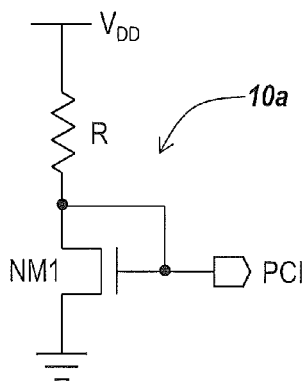
FIG. 2A is an electrical schematic of a process corner detection (PCD) circuit according to an embodiment of the present invention, which may be used in the integrated circuit device of FIG. 1.
Figure 2B:
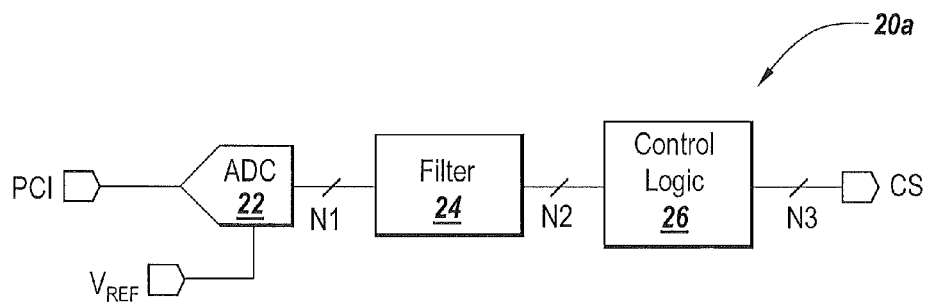
FIG. 2B is a block diagram of a control circuit according to an embodiment of the present invention, which may be used in the integrated circuit device of FIG. 1.

An exemplary embodiment of the PCD circuit 10 of FIG. 1 is illustrated as a PCD circuit 10a of FIG. 2A, which includes a totem pole arrangement of a resistor R and an NMOS transistor NM1 connected as illustrated. The gate and drain terminals of the NMOS transistor NM1 are electrically connected together so that the NMOS transistor NM1 performs the function of a MOS diode, which generates a process corner indication (PCI) signal having a magnitude proportional to a threshold voltage of the NMOS transistor NM1. This proportionality is typically not linear. As will be understood by those skilled in the art, increases in magnitude of the PCI signal can reflect a relatively slow NMOS process corner and decreases in magnitude of the PCI signal can reflect a relatively fast NMOS process corner. As shown by FIGS. 1 and 2B, the PCI signal is provided as an input to a control circuit 20a, which is illustrated as including a series arrangement of a analog-to-digital (ADC) converter 22, which may be responsive to a voltage reference signal $V_{REF}$, a digital filter 24 and control logic 26, which is configured to generate a multi-bit control signal CS. The number of signal lines N1, N2 and N3 associated with the outputs of the ADC converter 22, filter 24 and control logic 26 need not be equal.

Figure 2C:
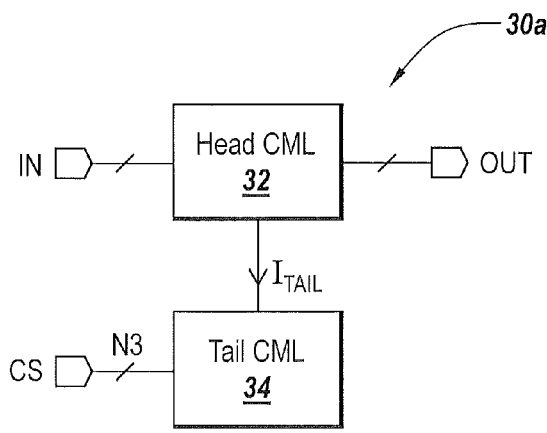
FIG. 2C is a block diagram of a current mode logic circuit according to an embodiment of the present invention, which may be used in the integrated circuit device of FIG. 1.

According to one embodiment of the control circuit 20a of FIG. 2B, increases in magnitude of the PCI signal relative to a magnitude of the voltage reference signal $V_{REF}$ can result in a generation of a multi-bit control signal CS having a greater number of asserted bits. Alternatively, decreases in magnitude of the PCI signal relative to a magnitude of the voltage reference signal $V_{REF}$ can result in a generation of a multi-bit control signal CS having a smaller number of asserted bits. As shown by FIG. 2C, this multi-bit control signal CS may be provided to a tail portion 34 of a current mode logic circuit 30a, which is configured to sink a tail current (e.g., $I_{TAIL}$) from a head portion 32 of the current mode logic circuit 30a. As explained more fully hereinbelow, this tail current $I_{TAIL}$ may be varied in response to changes in the number of asserted bits within the multi-bit control signal CS.

Figure 3A:
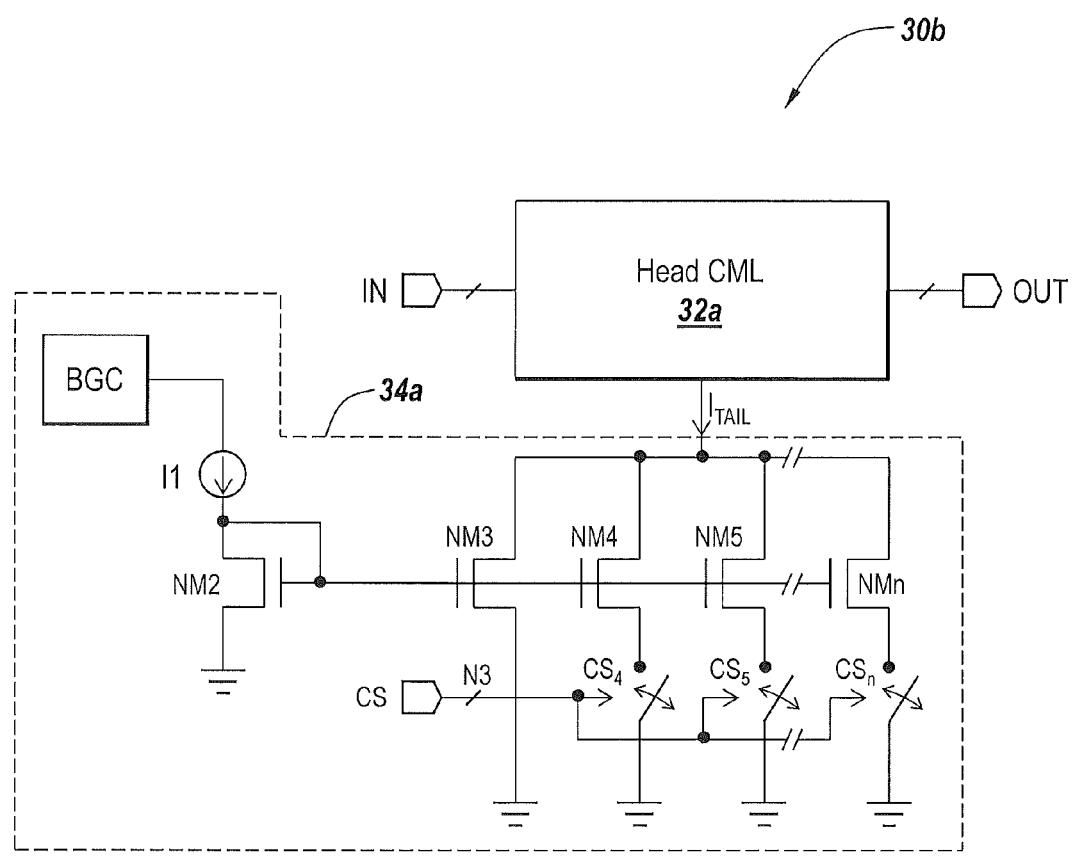
FIGS. 3A-3B are electrical schematics of an embodiment of the current mode logic circuit of FIG. 2C, according to an embodiment of the present invention.
Figure 3B:
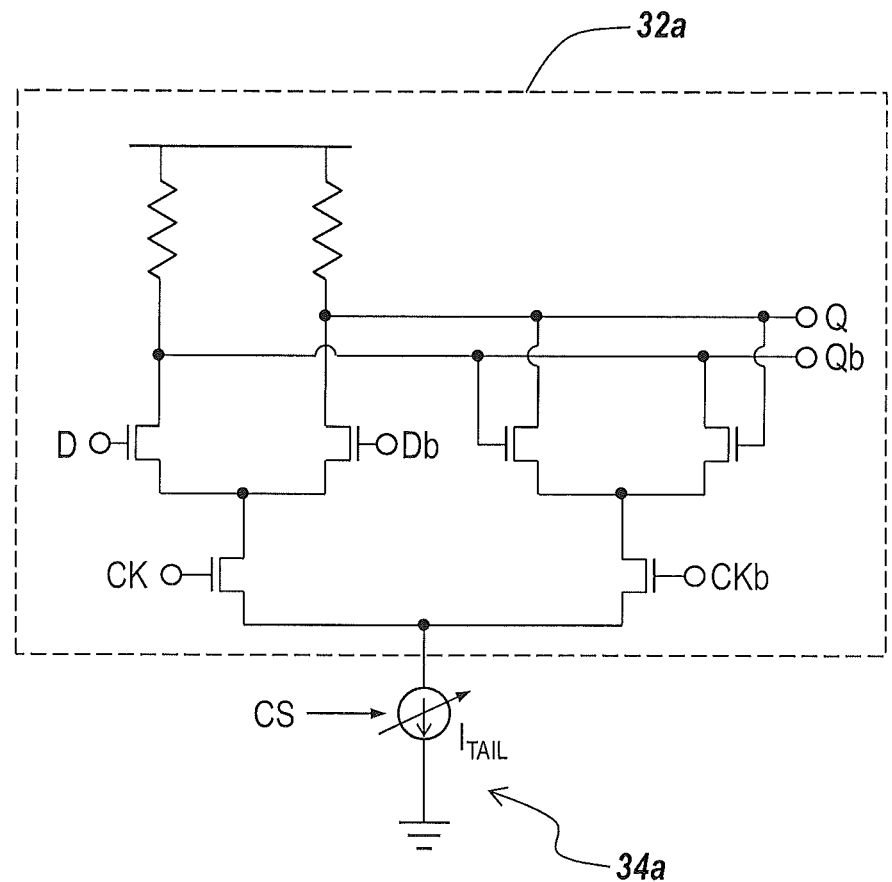

In particular, as shown by the current mode logic circuit 30b of FIGS. 3A-3B, one embodiment of a head portion 32a of the current mode logic circuit 30b is illustrated as a synchronous D-type latch, which is configured to generate a pair of differential output signals Q/Qb in response to a pair of differential input signal D/Db. The timing of the D-type latch is controlled by a pair of differential clock signals CK/CKb and the speed of the D-type latch is influenced by a magnitude of the tail current $I_{TAIL}$, which is sinked by a tail portion 34a of the current mode logic circuit 30b. As illustrated by FIG. 3A, this tail portion 34a of the current mode logic circuit 30b operates as a variable current source, which is responsive to the multi-bit control signal CS. In particular, the tail portion 34a is illustrated as including a current mirror, which is defined by NMOS transistors NM2-NMn and a current source I1, which receives a bias current from a band gap circuit BGC. As shown, each bit $CS_4$-$CS_n$ of the control signal CS controls a respective switch within a corresponding parallel leg of the current mirror. The NMOS transistors NM4-NMn, which may have equivalent widths or variable widths (e.g., 1×, 2×, 4×, 8×, . . . ), for example, may collectively operate to provide a finely controllable tail current $I_{TAIL}$. In this manner, the PCI and CS signals can be generated to accurately compensate for variations in a process corner associated with the elements (e.g., NMOS transistors) of head portion 32a of the current mode logic circuit 30b. Similar signals may also be used in current mode logic circuits having exclusively PMOS and combinations of NMOS and PMOS transistors therein.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device, comprising:
    a current-mode logic (CML) circuit responsive to at least one input signal;
    a variable current source electrically coupled to said CML circuit, said variable current source configured to sink or source a first current from or to said CML circuit in response to a first control signal; and
    a control circuit configured to generate the first control signal in response to a process corner indication signal, said control circuit comprising an analog-to-digital converter responsive to the process corner indication signal.

2. The device of claim 1, further comprising a process corner detection circuit configured to generate the process corner indication signal having a magnitude that estimates a relative speed of a process corner associated with the integrated circuit device.

3. The device of claim 2, wherein the process corner indication signal has a magnitude that estimates a relative speed of an NMOS or PMOS process corner associated with the integrated circuit device.

4. The device of claim 3, wherein the process corner detection circuit comprises a MOS diode configured to generate the process corner indication signal.

5. The device of claim 2, wherein the process corner detection circuit comprises a MOS diode configured to generate the process corner indication signal.

6. The device of claim 5, wherein the first control signal is a multi-bit digital signal; wherein said variable current source comprises a plurality of parallel-connected MOS transistor circuits having commonly-connected gate terminals; and wherein at least two of the plurality of parallel-connected MOS transistor circuits comprise switches responsive to the multi-bit digital signal.

7. The device of claim 6, wherein said variable current source comprises a current mirror.

8. The device of claim 2, wherein said variable current source comprises a plurality of parallel-connected MOS transistor circuits having commonly-connected gate terminals; and wherein at least one of the plurality of parallel-connected MOS transistor circuits comprises a switch responsive to the first control signal.

9. The device of claim 2, wherein the process corner detection circuit comprises a MOS diode configured to generate the process corner indication signal; wherein said variable current source comprises a plurality of parallel-connected MOS transistor circuits having commonly-connected gate terminals; and wherein at least one of the plurality of parallel-connected MOS transistor circuits comprises a switch responsive to the first control signal.

10. The device of claim 1, wherein the analog-to-digital converter is further responsive to a reference voltage.

11. The device of claim 1, wherein said CML circuit is a D-type latch responsive to a pair of differential clock signals.

12. An integrated circuit device, comprising:
    a current-mode logic (CML) circuit comprising a head circuit configured to generate an output signal in response to at least one input signal and a tail circuit electrically coupled to the head circuit, said tail circuit comprising at variable current source therein responsive to at least one control signal; and
    a control circuit configured to generate the at least one control signal in response to a process corner indication signal, said control circuit comprising an analog-to-digital converter responsive to the process corner indication signal.

13. The device of claim 12, further comprising a process corner detection circuit configured to generate the process corner indication signal having a magnitude that estimates a relative speed of a process corner associated with said CML circuit.

14. The device of claim 13, wherein the process corner indication signal has a magnitude that estimates a relative speed of an NMOS or PMOS process corner associated with said CML circuit.

15. The device of claim 14, wherein said process corner detection circuit comprises a voltage divider having a MOS diode therein; and wherein the process corner indication signal is generated at a gate terminal of the MOS diode.

16. The device of claim 12, wherein the analog-to-digital converter is further responsive to a reference voltage.

17. An integrated circuit device, comprising:
    a current-mode logic (CML) circuit comprising a head circuit configured to generate an output signal in response to at least one input signal and a tail circuit electrically coupled to the head circuit, said tail circuit comprising at variable current source therein responsive to a multi-bit digital control signal;
    a control circuit configured to generate the multi-bit digital control signal in response to performing an analog-to-digital conversion on a process corner indication signal; and
    a process corner detection circuit configured to generate the process corner indication signal.

18. The device of claim 17, wherein the analog-to-digital conversion is performed by an analog-to-digital converter, which is responsive to the process corner indication signal and a reference voltage.

19. The device of claim 18, wherein said process corner detection circuit comprises a series arrangement of a resistor and a MOS diode.

20. The device of claim 19, wherein the resistor has a first current carrying terminal responsive to a power supply voltage and a second current carrying terminal electrically connected to drain and gate terminals of an NMOS transistor; and wherein the process corner indication signal is generated at the drain and gate terminals of the NMOS transistor.

* * * * *